(12) United States Patent
Huo et al.

(10) Patent No.: US 9,088,153 B2
(45) Date of Patent: Jul. 21, 2015

(54) SERIES R-C GRADED GAP ASSEMBLY FOR MOV ARRESTER

(71) Applicant: Hubbell Incorporated, Shelton, CT (US)

(72) Inventors: Xingniu Huo, Medina, OH (US); Dennis Wilbur Lenk, Medina, OH (US); Bo Gao, Beijing (CN); Hongsheng Guo, Beijing (CN)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 13/627,728

(22) Filed: Sep. 26, 2012

(65) Prior Publication Data

US 2014/0085764 A1 Mar. 27, 2014

(51) Int. Cl.
| | |
|---|---|
| H01C 7/12 | (2006.01) |
| H02H 1/00 | (2006.01) |
| H02H 1/04 | (2006.01) |
| H02H 3/22 | (2006.01) |
| H02H 9/06 | (2006.01) |
| H05K 13/00 | (2006.01) |

(52) U.S. Cl.
CPC ............. *H02H 9/06* (2013.01); *H05K 13/0023* (2013.01)

(58) Field of Classification Search
USPC .......................................... 361/111–120, 127
See application file for complete search history.

(56) References Cited

U.S. PATENT DOCUMENTS

| | | | |
|---|---|---|---|
| 3,019,367 A | 1/1962 | Kalb | |
| 3,566,183 A | 2/1971 | Olsen | |
| 3,576,458 A | 4/1971 | Smith, Jr. | |
| 3,611,044 A | 10/1971 | Osterhout | |
| 3,733,521 A | 5/1973 | Kalb | |
| 3,859,569 A | 1/1975 | Kresge | |
| 3,967,160 A | 6/1976 | Kresge | |
| 3,973,172 A | 8/1976 | Yost | |
| 4,004,193 A | 1/1977 | Reckard | |
| 4,134,146 A | 1/1979 | Stetson | |
| 4,174,530 A | 11/1979 | Kresge | |
| 4,326,233 A * | 4/1982 | Yanabu et al. ................. 361/127 |
| 4,908,730 A | 3/1990 | Westrom | |
| 5,047,891 A | 9/1991 | Nedriga | |
| 5,594,613 A | 1/1997 | Woodworth | |
| 5,708,555 A | 1/1998 | Woodworth | |
| 6,459,559 B1 | 10/2002 | Christofersen | |
| 6,493,201 B1 | 12/2002 | Kulkarni | |
| 6,828,895 B1 * | 12/2004 | Huo et al. ....................... 337/30 |
| 7,015,786 B2 | 3/2006 | Ramarge | |
| 7,414,526 B2 | 8/2008 | Zitting | |
| 7,522,812 B2 | 4/2009 | Zitting | |
| 2004/0239472 A1 | 12/2004 | Huo | |
| 2006/0290476 A1 | 12/2006 | Zitting | |
| 2008/0297327 A1 | 12/2008 | Zitting | |

FOREIGN PATENT DOCUMENTS

JP 3208280 9/1991

* cited by examiner

*Primary Examiner* — Thienvu Tran
*Assistant Examiner* — Christopher Clark
(74) *Attorney, Agent, or Firm* — Michael Best & Friedrich LLP

(57) ABSTRACT

A gap assembly for a arrester includes a spark gap assembly and an MOV block disposed electrically in series with the spark gap assembly. The spark gap assembly includes a resistor, a capacitor disposed electrically in series with the resistor and a spark gap disposed electrically parallel to the resistor and to the capacitor.

23 Claims, 12 Drawing Sheets

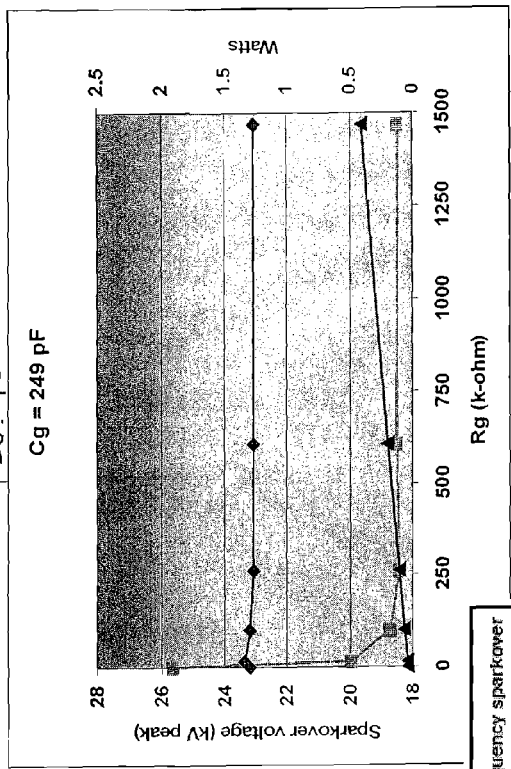
FIG. 9
FIG. 10
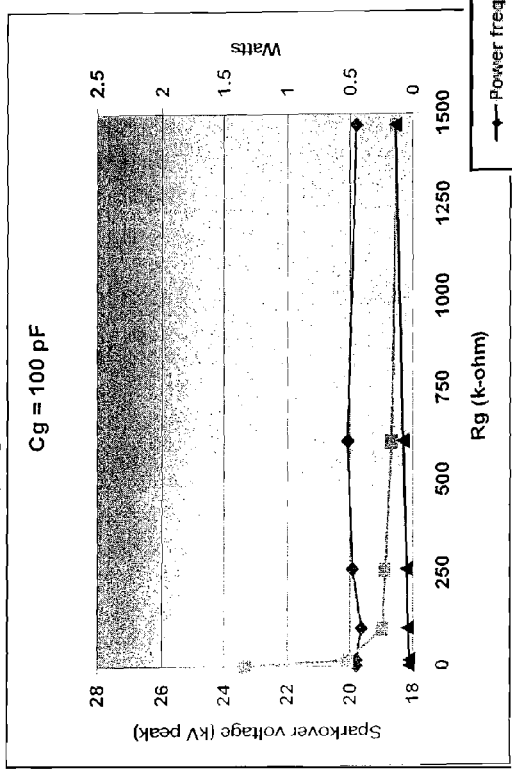
FIG. 11
FIG. 12
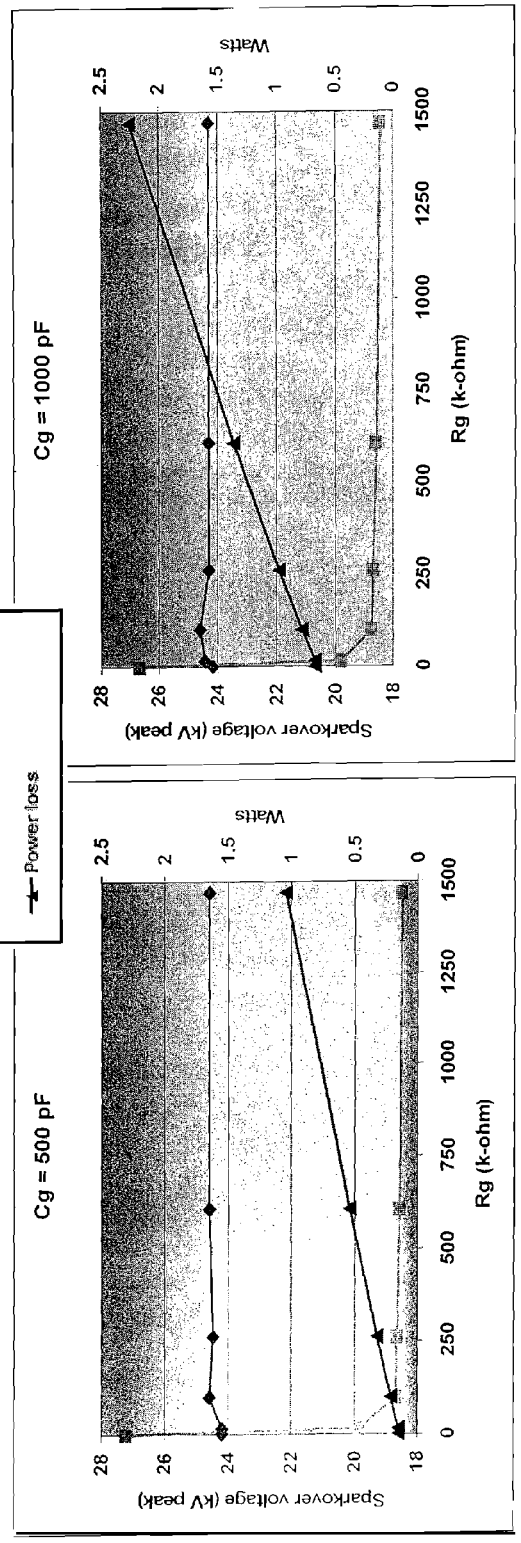

# SERIES R-C GRADED GAP ASSEMBLY FOR MOV ARRESTER

FIELD OF THE INVENTION

The present invention relates generally to an arrester in which series connected resistor and capacitor grading components are electrically parallel a spark gap. More particularly, the present invention relates to a spark gap assembly for an arrester in which series connected resistor and capacitor grading components are electrically parallel a single spark gap and the spark gap assembly is electrically in series with at least one metal-oxide varistor (MOV). Still more particularly, the present invention relates to an arrester in which a spark gap assembly, which includes series connected resistor and capacitor grading components electrically parallel a spark-gap, is electrically in series with at least one MOV and the impedance of the MOV is matched by the capacitor of the spark gap assembly.

BACKGROUND OF THE INVENTION

Spark gaps have been used for many years in surge arresters to protect the insulation of utility high voltage power equipment from damage associated with system overvoltages, such as temporary power frequency and lightning surges. Conventional gapped arresters connected spark gaps in series with silicon carbide non-linear resistors. The spark gaps provided the spark over function while the silicon carbide resistors controlled the arrester follow current to a level that the spark gap could interrupt.

Other conventional arrester designs have utilized spark gaps with various combinations of spark gap grading components (connected directly in parallel with the spark gap) to control the voltage distribution across the spark gap(s) when exposed to various overvoltage waveforms. Proper control of the voltage distribution across the series gap(s) was needed to provide stable behavior of the arrester spark over characteristic.

Spark gaps have been designed with resistors, capacitors, or parallel combinations of resistors and capacitors, each component individually oriented in parallel with the spark gap. The primary purpose of the gap grading resistor was to control the voltage distribution between the series-connected gaps inside an arrester to assure that the arrester did not spark over under normal voltage power frequency conditions, including severely contaminated environments. Capacitors used in parallel with the spark gap(s) were instituted to cause a voltage upset between the arrester's series-connected gaps. This induced voltage upset, between spark gaps, controlled the spark over level of the arrester when exposed to voltage surges of varying frequencies (such as high frequency lightning and lower frequency switching surges) to a value that would protect equipment installations. Essentially, within the series gap structure, voltage was redistributed as a function of overvoltage and frequency of the surge.

More recently, arresters have been made with metal-oxide non-linear resistors (often referred to as metal oxide varistors, or MOV). MOV have improved non-linear resistor characteristics over the formerly used silicon carbide resistors, such that the spark gap used in silicon carbide arrester designs was eliminated.

A conventional gapless metal-oxide arrester contains for its voltage limiting feature a plurality of metal-oxide varistor (MOV) elements 1 stacked in series, as shown in FIG. 1. MOV elements are typically substantially cylindrical in shape and have a diameter typically in the range of approximately 25 mm to 75 mm and a height typically in the range of approximately 25 mm to 45 mm.

A distribution arrester with a duty cycle rated voltage of 9 kVrms and a maximum continuous operating voltage (MCOV) of 7.65 kVrms, for typical use on a 12.47 kVrms 3-phase distribution system, would typically contain two or three MOV elements 1. One particular example of such an arrester could contain two MOV elements, each having a diameter of 36 mm and a height of 35 mm, as shown in FIG. 1. Va is the total voltage impressed across the arrester. Vm is the fraction of Va that appears across each of the MOV elements 1.

Vm=0.5 Va for the case of two equal MOV elements, and this is virtually independent of the frequency of the applied voltage. Fast rising voltage impulses, such as those produced by lightning surges, have high frequency components that may be in the MHz range. For example, the time to crest of a voltage of frequency of 0.25 MHz is 1 microsecond, which is of the same order as the rise time of a fast rising lightning impulse voltage.

Another conventional distribution arrester includes an MOV element 2 electrically in series with a simple spark-gap 3, as shown in FIG. 2. Va is the total voltage impressed across the arrester. Vg is the fraction of Va that appears across the spark gap 3. Vm is the fraction of Va that appears across the MOV element 2. In the conventional arrester shown in FIG. 2, with no grading components connected across the spark gap 3, virtually all the voltage Va appears across the gap under normal operating conditions; i.e. Vg=Va and Vm=0, where Va=Vg+Vm.

At a sufficiently high value of Va (for example, during an overvoltage surge caused by a lightning stroke on or near the distribution system), the spark gap 3 will spark over and all the voltage will be impressed on the MOV element 2. The MOV element 2 conducts the surge current and limits the impressed voltage according to the non-linear volt-amp characteristic of the MOV element 2. This type of gapped arrester has the advantage that under normal system operating conditions, there is no voltage across the MOV, and therefore there are no power losses (this is in contrast to the gapless design of FIG. 1). A further advantage is that this type of gapped arrester can use a considerably reduced amount of MOV elements 2 compared to a gapless arrester (FIG. 1) because there is no power frequency voltage across the MOV under normal operating conditions. When there is a high voltage surge that causes the spark gap 3 to spark over, all the voltage is transferred to the MOV element 2. The duration of the surge is sufficiently short such that the MOV element 2 can survive the imposed electrical stresses, and after the surge ends the gap "re-seals" to again remove the power system voltage from the MOV element 2. An advantage of using a reduced amount of MOV elements 2 compared to a gapless arrester (FIG. 1) is that the surge voltage limitation is improved; i.e. the surge voltage is limited to a lower level for the same amount of surge current. For example, if the gapped arrester uses only one MOV element compared to two MOV elements of the gapless arrester, the limiting voltage of the gapped arrester (after the gap sparks over) will be 50% of the limiting voltage of the gapless arrester for the same surge current. This is advantageous in that the equipment being protected by the arrester will experience reduced levels of surge voltage for the case of the gapped arrester, providing an improved "margin of protection".

However, a significant disadvantage of the gapped arrester of FIG. 2 is that it is difficult to control the spark over behavior of the spark gap 3. Simple gaps possess a characteristic that the voltage required to spark over the gap increases with frequency. Fast rising voltage impulses, such as those produced by lightning surges have high frequency components that may be in the MHz range. For example, the time to crest of a voltage of frequency of 0.25 MHz is 1 μs, which is of the same order as the rise time of a fast rising lightning impulse voltage. The voltage required to spark over the gap for a fast rising lightning impulse can be greater than the voltage to which the MOV element will limit the voltage after the gap sparks over. The equipment being protected will experience this higher voltage, and the "margin of protection" is reduced accordingly. In certain cases, for very fast rising surges, the gap spark over voltage can exceed the limiting voltage of a gapless arrester (FIG. 1), in which case the gapped arrester (FIG. 2) performs an inferior job of protection compared to the gapless arrester.

To partially overcome the problem with spark over characteristics of a simple spark gap, another conventional arrester includes a resistive grading element 4, Rg, connected across the spark gap 5, as shown in FIG. 3. Va is the total voltage impressed across the arrester. Vg is the fraction of Va that appears across the spark gap 5. Vm is the fraction of Va that appears across the MOV element 6. Rg is typically in the range of 40-100 MΩ While this helps address the gap spark over control issue, it re-introduces the issue of power losses. Power losses of this type of design can easily be greater than those of gapless designs of the same MCOV.

SUMMARY OF THE INVENTION

Recent laboratory investigations have indicated that the protective capability of MOV type arresters can be enhanced by reintroduction of an appropriately designed graded spark gap structure connected in series with the MOV elements (discs). Grading resistors and capacitors are conventionally connected in parallel with the spark gap to maintain a uniform distribution among the spark gaps, but a single resistor-capacitor (R-C) graded spark gap in series with an MOV disc has not been used to reduce the impulse protection level by taking advantage of the interaction (as a function of voltage and frequency) of the spark gap series R-C grading and the MOV disc impedance.

The spark gap grading of the present invention includes a series connected resistor-capacitor (R-C) combination located electrically in parallel with the spark gap. This series R-C graded spark gap is connected in series with the MOV disc. At normal power frequency voltages, the distribution of total applied line-ground system voltage is shared between the R-C graded gap and the MOV disc, and is controlled by the interaction of R-C values of the spark gap grading and the MOV impedance. Use of the series R-C graded spark gap allows multiple gaps to be connected in series with multiple MOV discs and still provide a controlled spark over characteristic.

When the arrester is subjected to overvoltage surge conditions, the interaction of the series R-C gap impedance with the inherent capacitance and non-linear resistance of the MOV disc causes a redistribution of voltage away from the MOV disc towards the gap. With appropriate selection of the resistor and capacitor components of the spark gap structure, the spark gap spark over voltage can be controlled to a level that is lower than the discharge voltage appearing across the MOV disc.

In accordance with an aspect of the present invention, a gap assembly for an arrester includes at least one spark gap assembly and at least one MOV black disposed electrically in series with the at least one spark gap assembly. The spark gap assembly includes a resistor and a capacitor disposed electrically in series with the resistor. A spark gap is disposed electrically parallel to the resistor and to the capacitor.

In accordance with another aspect of the present invention, a spark gap assembly for an arrester includes a spark gap assembly and at least one MOV block disposed electrically in series with the spark gap assembly. An insulative cylinder has a first bore and a second bore. At least one resistor is disposed in the first bore. At least one capacitor is disposed in the first bore and electrically in series with the at least one resistor. A spring member is disposed in the first bore and biases one of the at least one capacitor and the at least one resistor toward the other. A spark gap is disposed in the second bore and electrically parallel to the at least one resistor and to the at least one capacitor.

In accordance with another aspect of the invention, a method is provided of assembling an arrester in which a series capacitor and resistor are disposed electrically parallel to a spark gap to form a spark gap assembly. The spark gap assembly is disposed electrically in series with at least one MOV block. The impedance of the capacitor and the resistor is matched with the impedance of the MOV block.

Objects, advantages, and salient features of the invention will become apparent from the following detailed description, which, taken in conjunction with the annexed drawings, discloses an exemplary embodiment of the present invention.

As used in this application, the terms "front," "rear," "upper," "lower," "upwardly," "downwardly," and other orientational descriptors are intended to facilitate the description of the exemplary embodiments of the present invention, and are not intended to limit the structure thereof to any particular position or orientation.

BRIEF DESCRIPTION OF THE DRAWINGS

The above benefits and other advantages of the various embodiments of the present invention will be more apparent from the following detailed description of exemplary embodiments of the present invention and from the accompanying drawing figures, in which:

FIGS. 9-12 are graphs of impulse sparkover voltage, power-frequency sparkover voltage and power loss as functions of the resistance and capacitance grading components for an MOV having a diameter of 75 mm, length of 44 mm and capacitance of 710 pF;

Throughout the drawings, like reference numerals will be understood to refer to like parts, components and structures.

DETAILED DESCRIPTION OF EXEMPLARY EMBODIMENT

Figure 4:
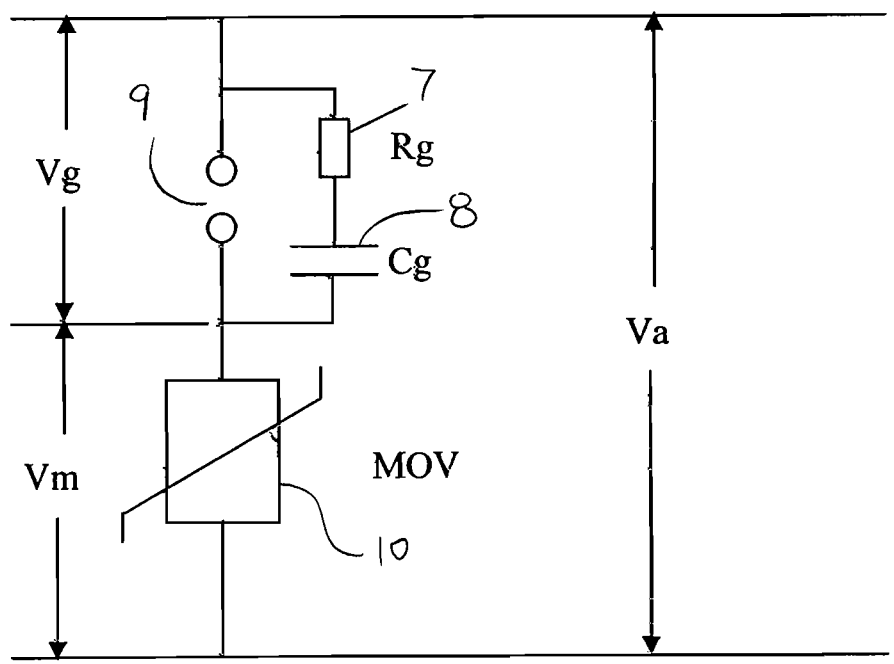
FIG. 4 is a schematic electrical diagram of an arrester in which series resistance and capacitance grading components are electrically parallel to the spark-gap in accordance with an exemplary embodiment of the present invention.
Figures 5, 6, 7, 8:
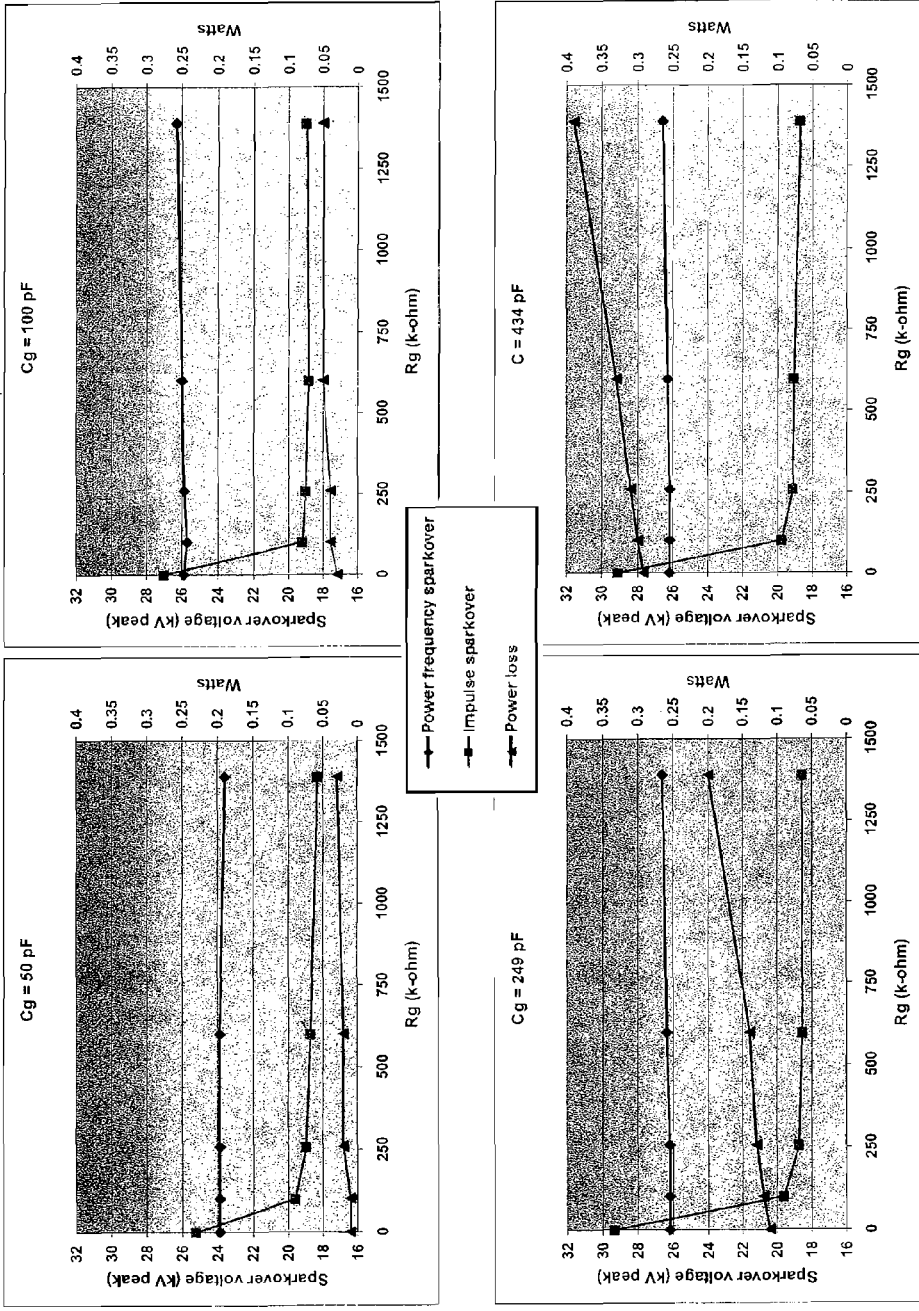
FIGS. 5-8 are graphs of impulse sparkover voltage, power-frequency sparkover voltage and power loss as functions of the resistance and capacitance grading components for an MOV having a diameter of 36 mm, length of 42 mm and capacitance of 170 pF.

In accordance with an exemplary embodiment of the present invention, the problem associated with the spark over characteristic of a simple gap, while also addressing the power loss issue, is overcome by disposing resistance (Rg) and capacitance (Cg) grading components 7 and 8 across the spark gap 9, as shown in FIG. 4. Va is the total voltage impressed across the arrester. Vg is the fraction of Va that appears across the spark gap 9. Vm is the fraction of Va that appears across the MOV element 10.

The values of Rg 7 and Cg 8 are selected to control the division of Va into its components Vg and Vm. Moreover, the values can be selected such that the proportion of the total voltage that appears across the gap 9 increases with frequency, thus compensating for the characteristic of the gap sparkover voltage increasing with frequency. The appropriate selection of values for Rg and Cg is dependent on the impedance of the MOV block 10, which may be represented by its capacitance Cm (effectively constant for a wide range of frequencies and impressed voltages) and a voltage-dependent non-linear resistance Rm. The proportion of the voltage appearing across the spark gap 9 is given by:

$Vg/Va = Zg/(Zg+Zm)$, where $Zg$=impedance of series Rg and Cg, and $Zm$=impedance of the MOV block.

Factors to be considered in selecting a suitable combination of Rg 7 and Cg 8 are described in the following paragraphs.

Preferably, the proportion of the total voltage that appears across the spark gap 9 increases with frequency, thus compensating for the characteristic of the gap sparkover voltage increasing with frequency. High values of Rg would be better, because this lowers the frequency at which the percentage of total voltage appearing across the spark gap begins to occur. However, higher values of Rg lead to higher power losses, which is not desirable.

At power frequencies, it is desirable to maintain a high voltage across the spark gap 9 to reduce the voltage appearing across the MOV element 10, thereby reducing the continuous stress on the MOV. Additionally, power loss of the arrester is reduced. This desirability suggests using low values of Cg. However, it is desirable to keep the voltage across the spark gap 9 at power frequencies as low as possible to provide more margin for temporary overvoltages that inevitably occur on power systems. This suggests using high values of Cg.

Because the desired characteristics appear to lead to conflicts in selecting values of Rg and Cg, it is not readily apparent what would be an "optimum" selection for a given arrester. The voltage-dependent non-linear resistance of the MOV element 10 adds more complexity to this determination.

Generally, arresters have (1) low impulse sparkover voltage, thereby providing good protection against impulse voltages, such as from lightning surges; and (2) high power-frequency sparkover voltage, thereby providing margin against temporary power-frequency overvoltages. Additionally, the arrester beneficially has low power losses under continuous energization (from the viewpoint of overall efficiency and cost of power). For such an arrester, with a particular value of MOV capacitance Cm, the combination of the gap electrode-to-electrode spacing and the grading components Rg and Cg can be selected to obtain a more-or-less "optimum" combination of low impulse sparkover voltage, high power frequency sparkover voltage and low power loss. As an example, FIGS. 5-8 (derived from laboratory experimental test data) show how these three characteristics are affected by variations in Rg and Cg for two different cases of a 9 kV rated arrester having only a single MOV element 10 and a spark gap 9 having electrode-to-electrode spacing of 5 mm. FIGS. 5-8 show the results when the MOV 10 has a 36 mm diameter, 42 mm length and capacitance of approximately 170 pF. FIGS. 9-12 show the results when the MOV has a 75 mm diameter, 44 mm length and capacitance of approximately 710 pF.

FIGS. 5-8 show that a very low value of Rg (below approximately 100 kΩ) results in an undesirable increase in impulse sparkover voltage. A very low value of Cg (approximately 50 pF or less) results in an undesirable reduction in the power frequency sparkover voltage. Increasing values of Rg and Cg result in undesirable increase of power losses. For a given capacitance, impulse sparkover voltage essentially stabilizes at a reduced level for large values of resistance (greater than approximately 100 k-ohms). For a given resistance, power-frequency sparkover stabilizes at an increased level for capacitance (approximately 100 pF and larger).

Some "trade off" is required to obtain a desirable "balance" between impulse sparkover voltage (lower the better), power frequency sparkover voltage (higher the better) and power loss (lower the better).

For the examples of FIGS. 5-8, a selection of Rg=100-250 kΩ and Cg=100 pF is suitable, thereby providing an arrester with an impulse sparkover voltage of about 19 kV. This impulse sparkover voltage is below the protective level of about 27 kV for a typical gapless 9 kV rated arrester using a 36 mm diameter MOV). The power frequency sparkover voltage is about 26 kV peak, which is above the peak phase-to-phase voltage of a 12.47 kVrms system on which a 9 kV rated arrester is typically applied. The power loss is about 0.04 watts, which is approximately one-tenth the power loss of a typical gapless 9 kV rated arrester using a 36 mm diameter MOV.

For the examples of FIGS. 9-12, a selection of Rg=100-250 kΩ and Cg=500 pF is suitable, thereby providing an arrester with an impulse sparkover voltage of about 18.8 kV. This impulse sparkover voltage is below the protective level of about 23 kV for a typical gapless 9 kV rated arrester using a 75 mm diameter MOV. The power frequency sparkover voltage is about 24.5 kV peak, which is above the peak phase-to-phase voltage of a 12.47 kVrms system on which a 9 kV rated arrester is typically applied. The power loss is about 0.2-0.3 watts, which is approximately one-tenth the power loss of a typical gapless 9 kV rated arrester using a 75 mm diameter MOV.

The results of FIGS. 5-12 show that a preferred value of Cg is in the range of approximately 20-150% of the capacitance of the MOV, and more preferably in the range of approximately 50-80% of the capacitance of the MOV. A preferred value of Rg is in the range of approximately 10-1000 kΩ, and more preferably in the range of approximately 100-250 kΩ

As shown in FIG. 4, the voltage is shared between the MOV element 10 and the capacitor 8, such that the number of MOV elements typically used can be reduced by 20-50%.

As an example of the spark gap assembly of FIG. 4, the gap grading capacitance (C2=75 pF) is equal to the capacitance of the MOV block 10 (C1-75 pF). The linear resistor 7 is connected in series with the capacitor 8 and has a resistance of R=100 kilo-Ohms. Therefore, the gap impedance (Zg)=MOV impedance (Zm). At 60 Hz frequency, because Zg=Zm=35.4 Meg-Ohms, then Zg=Zm>>R=100 kilo-Ohms. Therefore, V1=V2=½ V. Thus, the linear resistor 7 does not affect the voltage distribution at 60 Hz, which is a normal power frequency.

Figure 1:
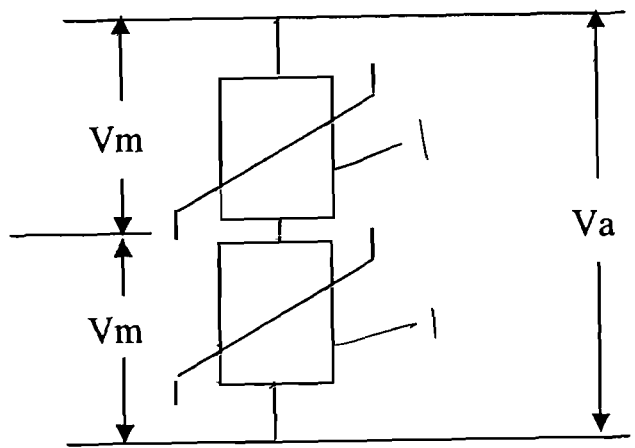
FIG. 1 is a schematic electrical diagram of a conventional gapless metal-oxide distribution arrester.
Figure 2:
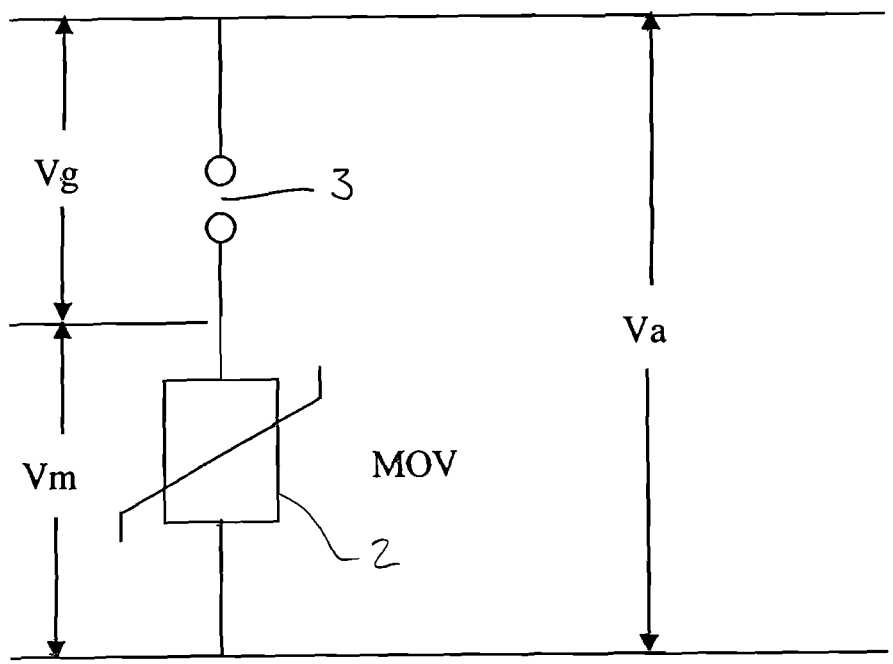
FIG. 2 is a schematic electrical diagram of a conventional distribution arrester in which an metal-oxide varistor (MOV) is in series with a spark-gap.
Figure 3:
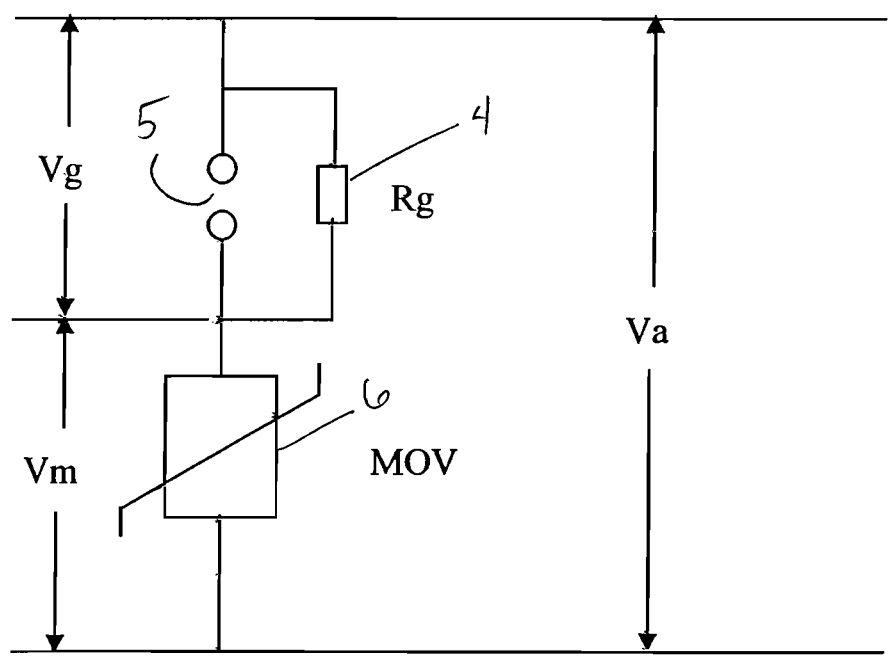
FIG. 3 is a schematic electrical diagram of a conventional distribution arrester in which a resistive grading component is electrically parallel to the spark-gap.

As an example of a lightning impulse situation (1.2/50 μS) at 200 kHz, Zc1=Zc2=10.6 kilo-Ohms. Now, Zc1=Zc2<<R=100 kilo-Ohms. Therefore, V2>>V1. Thus, when the lightning impulse voltage is applied to the arrester 14, the majority of the voltage crosses the spark gap 9, not the MOV element 10, because of the linear resistor 7. Accordingly, the spark gap 9 sparks over at a much lower voltage level compared to the arrester of FIG. 2. This series R-C grading circuit provides a non-uniform grading arrester that functions to produce a non-linear grading between the spark gap 9 and the MOV element 10 during lightning impulse conditions, and produces a linear grading between the spark gap 9 and the MOV element 10 at a power frequency.

Implementation of the series connected R-C components directly across the spark gap 9 allows control of the voltage that appears across the spark gap 9 when the arrester is exposed to a range of overvoltage conditions and frequencies, such as fast front lightning voltage surges cresting in less than one microsecond and 60 Hz overvoltages cresting in 4 milliseconds. The interaction of the spark gap's R-C impedance with the series-connected MOV element's impedance controls the voltage that appears across the spark gap 9 (as a function of the total applied voltage and the frequency of the overvoltage surge). Proper matching of the gap series R-C with the MOV element's inherent capacitance/non-linear resistance characteristic allows precise control of the sparkover characteristics over a range of frequencies.

Figure 13:
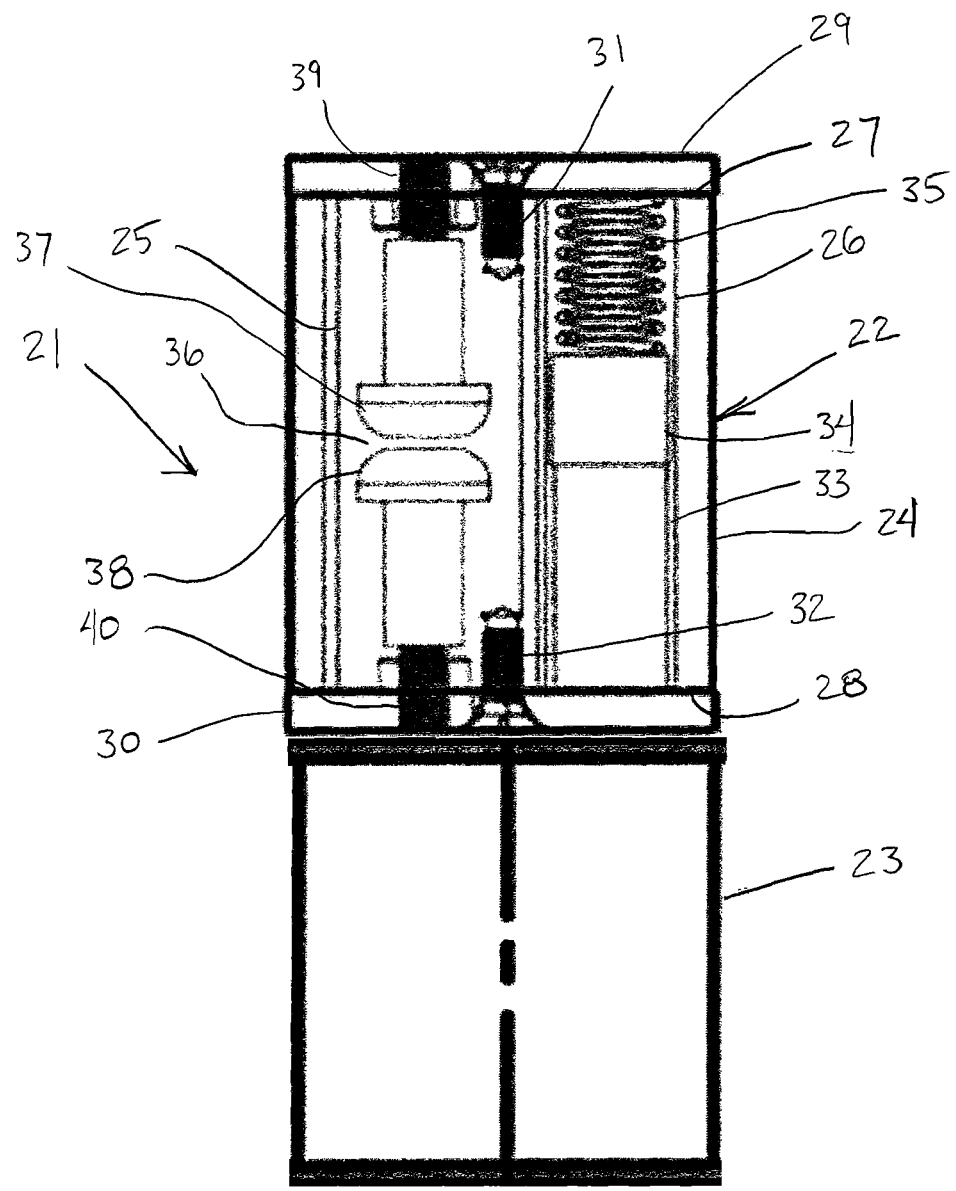
FIG. 13 is a side elevational view in partial cross section of series resistor-capacitor gap assembly in accordance with an exemplary embodiment of the present invention.

A gap assembly 21 in accordance with an exemplary embodiment of the present invention, as shown in FIG. 13, includes a spark gap assembly 22 electrically in series with an MOV element 23.

The spark gap assembly 23 includes an insulative housing 24 having a first bore 25 and a second bore 26 extending from an upper surface 27 of the housing 24 to a lower surface 28 thereof. An upper plate 29 is secured to the upper surface 27 of the housing 24 and a lower plate 30 is connected to the lower surface 28. The upper and lower plates 29 and 30 are made of a conductive material, such as, but not limited to, aluminum and copper. Fasteners 31 and 32 secure the upper and lower plates 29 and 30 to the upper and lower surfaces 27 and 28, respectively. The insulative housing 24 preferably has a diameter substantially equivalent to that of the MOV element 23, as shown in FIG. 13. The insulative housing 24 can be made of any suitable material, such as, but not limited to, ceramic, glass and nylon.

A spark gap 36 is disposed in the first bore 25. The spark gap 36 is formed between an upper electrode 37 connected to the upper plate 29 and a lower electrode 38 connected to the lower plate 30. Fasteners 39 and 40 secure the electrodes 37 and 38 to their respective plates 29 and 30.

Figure 15:
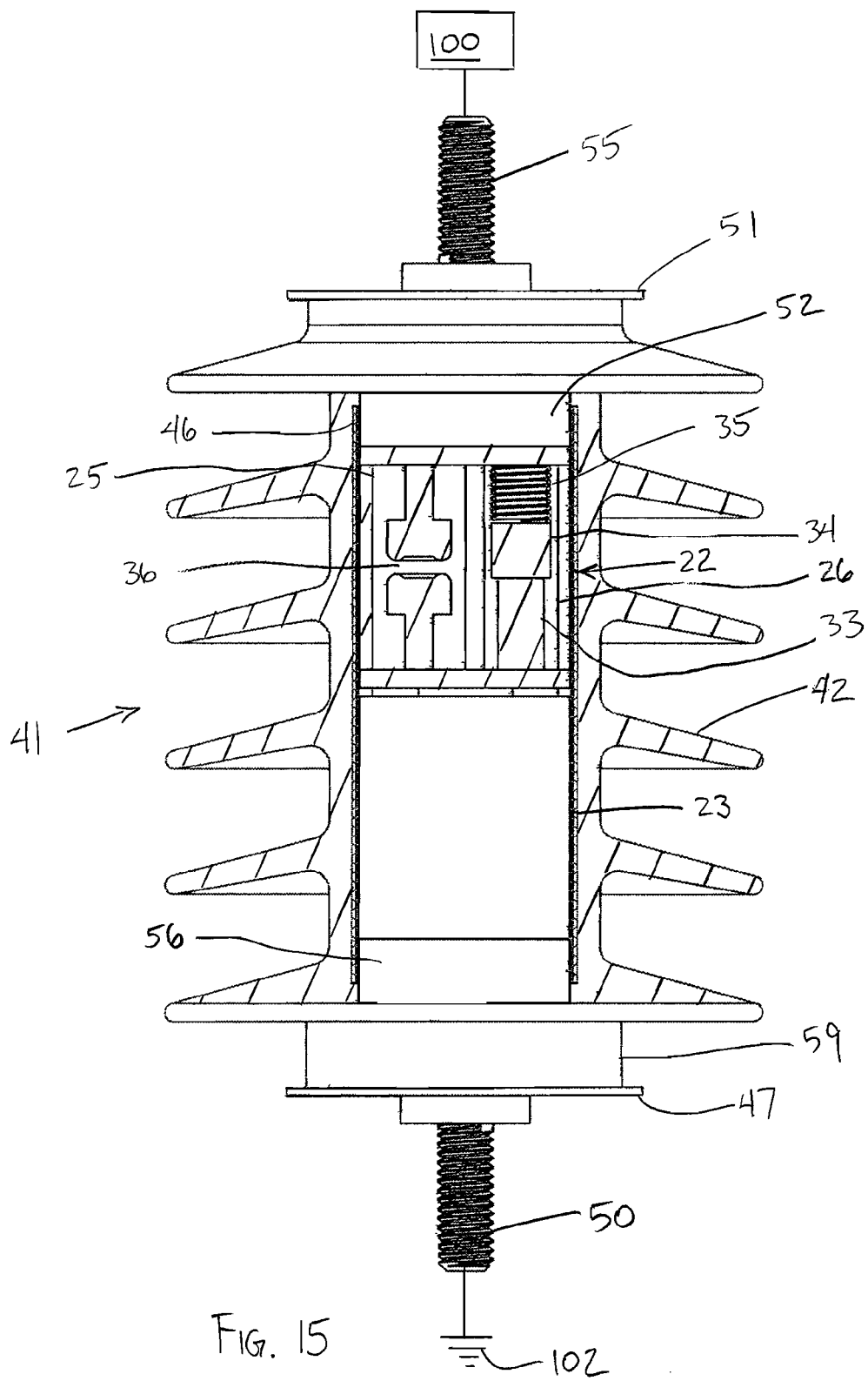
FIG. 15 is a front elevational view in partial cross section of the distribution arrester of FIG. 14 including the resistor-capacitor gap assembly.
Figure 16:
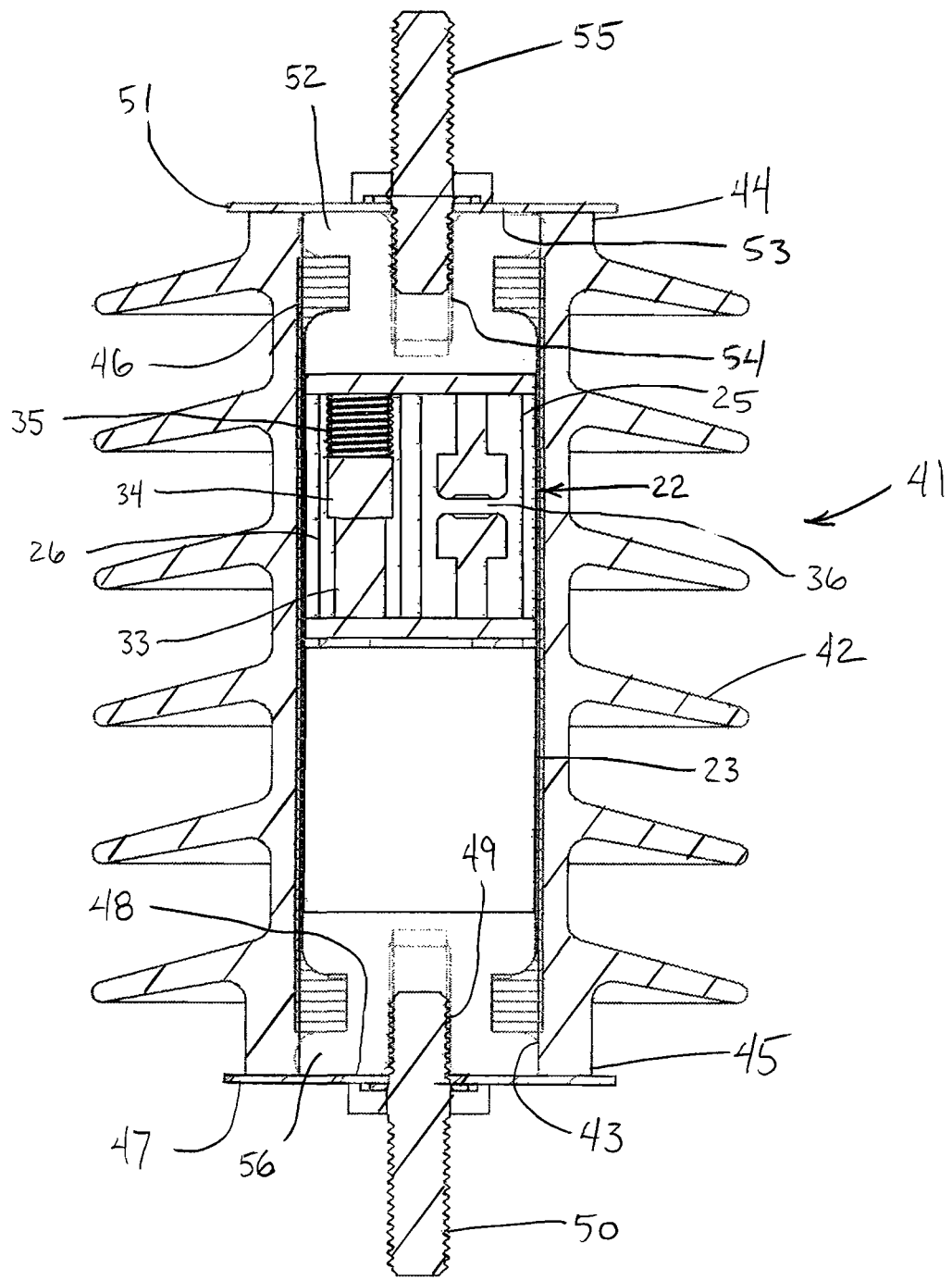
FIG. 16 is a front elevational view in cross section of the distribution arrester of FIG. 14 taken along line 16-16 including the resistor-capacitor gap assembly.

A resistor 33 and capacitor 34 are disposed in the second bore 26. As shown in FIGS. 4, 15 and 16 when only one resistor 33 and one capacitor 34 are used, the resistor 33 and capacitor 34 can be oriented in any suitable manner in the second bore 26 as long as the resistor 33 and capacitor 34 are parallel with the spark gap 38. The resistor 33 contacts the lower plate 30. A spring member 35 is disposed between the capacitor 34 and the upper plate 29, thereby biasing the capacitor 34 toward the resistor 33. Preferably, the spring member 35 is a compression spring. The first bore 25 preferably has a larger diameter than the second bore 26, as shown in FIGS. 15 and 16. Disposing the spark gap 36 in the first bore 25 and the resistor 33 and capacitor 34 in the second bore 26 isolates these two components from each other, thereby substantially preventing contamination of the resistor 33 and capacitor 34 by carbon created each time a spark crosses the spark gap 36. The resistor 33 can be a single resistor, or alternatively a plurality of resistors, connected in series with the capacitor and the compression spring and having the required resistance to match with the impedance of the series MOV disc. Additionally, as shown in FIGS. 17-20, additional capacitors can be connected in series with the resistor.

Figure 14:
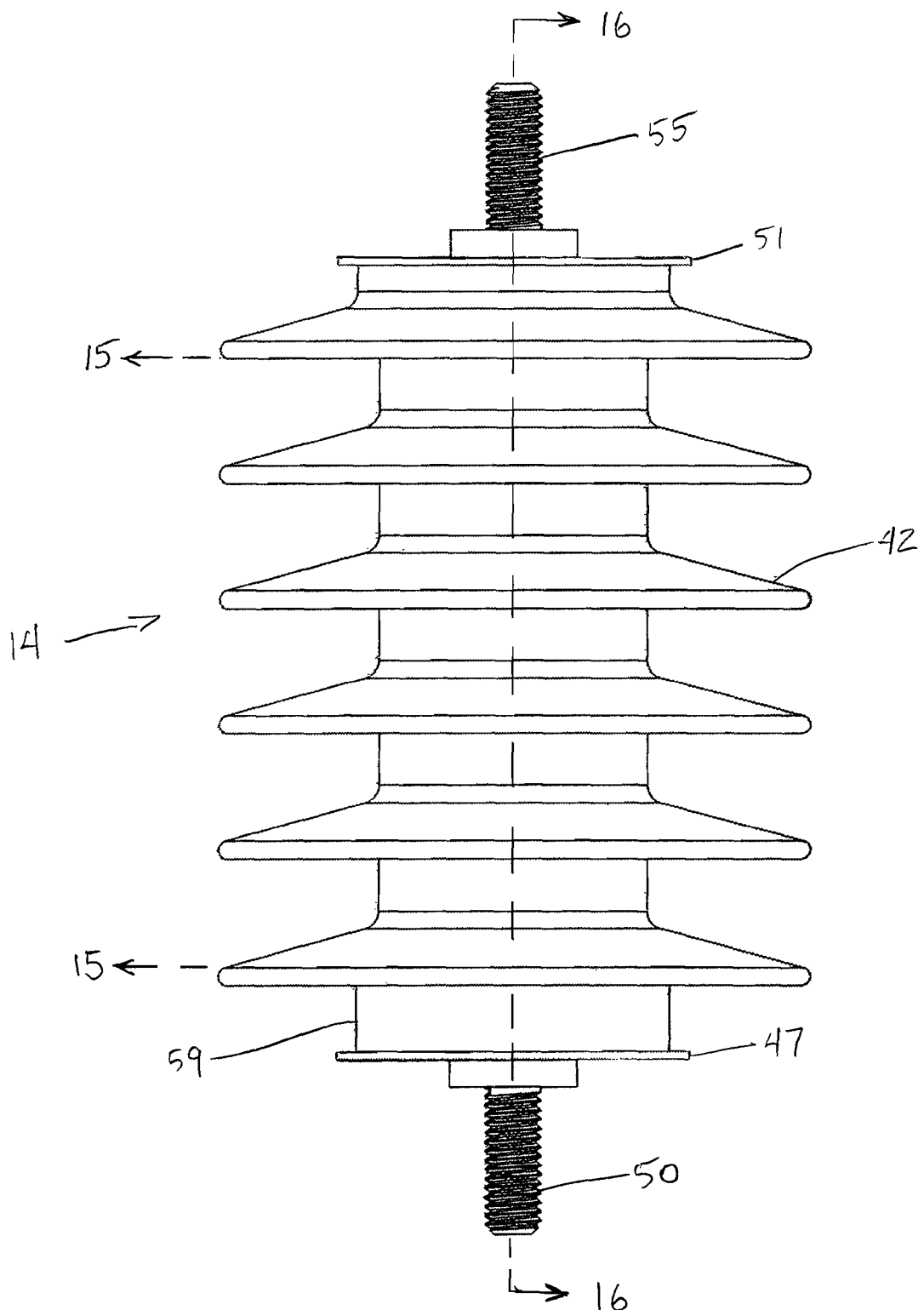
FIG. 14 is a front elevational view of a distribution arrester in accordance with an exemplary embodiment of the present invention.

The gap assembly 21 is disposed in an arrester 41, as shown in FIGS. 14-16. A weathershed housing 42 has a bore 43 extending from a first end 44 to a second end 45 of the housing 42. A tube 46 is disposed in the bore 43, as shown in FIGS. 15 and 16. Preferably, the tube 46 is made of fiberglass-epoxy, although any suitable material can be used. A lower plate 47 is disposed at the second end 45 of the housing 42. A lower terminal 56 is disposed on an upper surface 48 of the lower plate 47. An end of the lower terminal 56 has a fastener opening 49 to receive a lower terminal stud 50.

An upper plate 51 is disposed at the first end 44 of the housing 42. An upper terminal 52 is disposed adjacent a lower surface 53 of the upper plate 51. An end of the upper terminal 52 adjacent the upper plate 51 has a fastener opening 54 to receive an upper terminal stud 55.

The gap assembly 22 and the MOV element 23 are disposed within the tube 46 in the bore 43 in the arrester housing 42 between the upper terminal 52 and the lower terminal 50. The upper and lower terminal studs 55 and 50 are tightened to ensure electrical and mechanical connections from the upper terminal stud 55, through the components disposed in the housing bore 46 and to the lower terminal stud 50. The upper terminal stud 55 is connected to a power system 100. The lower terminal stud 50 is connected to ground 102. Bottom section 59 of the arrester housing 42 receives a bracket (not shown) connected to electrical equipment to be protected. The upper terminal 52 provides an electrical connection between the upper terminal stud 55 and the spark gap assembly 22. The lower terminal 56 provides an electrical connection between the MOV element 23 and the lower terminal stud 50.

Although the arrester 14 of FIGS. 14-16 shows a single spark gap assembly 22 and a single MOV element 23, any suitable number of spark gap assemblies and MOV elements can be used. Additional MOV elements 23 can be added in series.

Although the exemplary embodiments have been described with reference to the distribution arrester 41, the exemplary embodiments of the present invention are applicable to other types of arresters, such as, but not limited to, station class arresters, intermediate class arresters, Riser-Pole arresters, transmission line arresters and elbow arresters.

Figure 17:
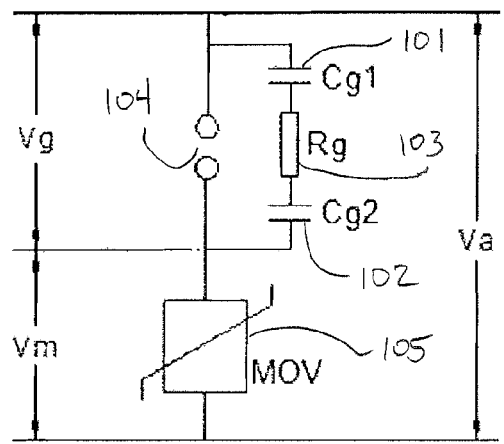
FIG. 17 is a schematic electrical diagram of an arrester in which series resistance and capacitance grading components are electrically parallel to the spark-gap assembly and having a capacitor on both sides of a resistor.

In accordance with another exemplary embodiment of the present invention shown in FIG. 17, two capacitors 101 (Cg1) and 102 (Cg2) are disposed in series with a resistor 103 (Rg) and parallel to a spark gap 104. Va is the total voltage impressed across the arrester. Vg is the fraction of Va that appears across the spark gap 104. Vm is the fraction of Va that appears across the MOV element 105. The capacitors 101 and 102 are disposed on opposite sides of the resistor 103.

Figure 18:
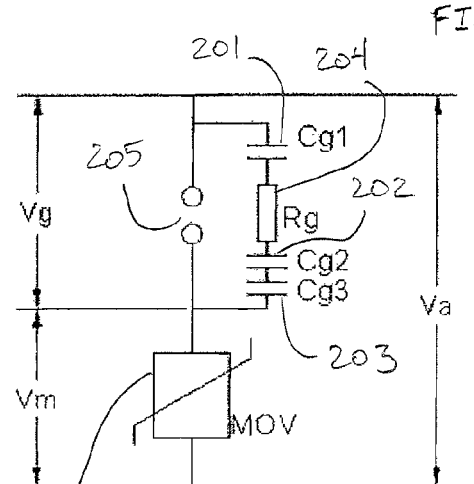
FIGS. 18 and 19 are schematic electrical diagrams of an arrester in which series resistance and capacitance grading components are electrically parallel to the spark-gap assembly and having a capacitor on one side of a resistor and two capacitors on the other.

In accordance with another exemplary embodiment of the present invention shown in FIG. 18, three capacitors 201 (Cg1), 202 (Cg2) and 203 (Cg3) are disposed in series with a resistor 204 (Rg) and parallel to a spark gap 205. Va is the total voltage impressed across the arrester. Vg is the fraction of Va that appears across the spark gap 205. Vm is the fraction of Va that appears across the MOV element 206. The second and third capacitors 202 and 203 are disposed on a first side of the resistor 204 (proximal the MOV element 206) and the first capacitor 201 is disposed on the opposite side of the resistor 204.

Figure 19:
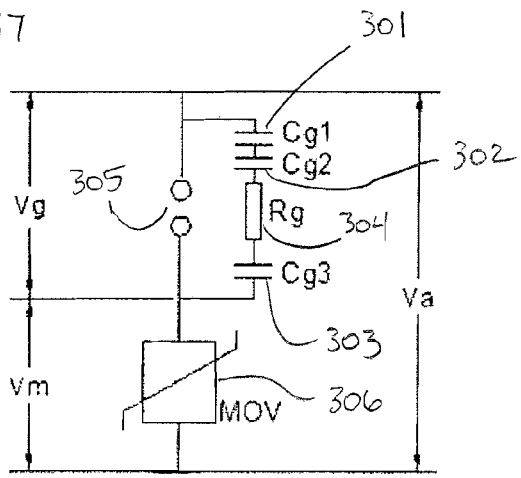

In accordance with another exemplary embodiment of the present invention shown in FIG. 19, three capacitors 301 (Cg1), 302 (Cg2) and 303 (Cg3) are disposed in series with a resistor 304 (Rg) and parallel to a spark gap 305. Va is the total voltage impressed across the arrester. Vg is the fraction of Va that appears across the spark gap 305. Vm is the fraction of Va that appears across the MOV element 306. The third capacitors 303 is disposed on a first side of the resistor 304 (proximal the MOV element 306) and the first and second capacitors 301 and 302 are disposed on the opposite side of the resistor 304.

Figure 20:
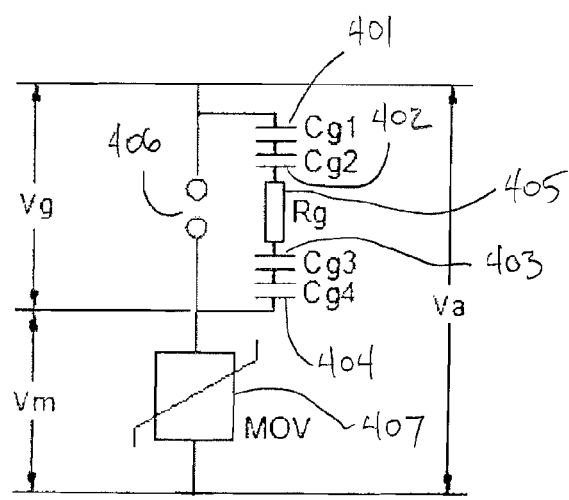
FIG. 20 is a schematic electrical diagram of an arrester in which series resistance and capacitance grading components are electrically parallel to the spark-gap assembly and having two capacitors on both sides of a resistor.

In accordance with another exemplary embodiment of the present invention shown in FIG. 20, four capacitors 401 (Cg1), 402 (Cg2), 403 (Cg3) and 404 (Cg4) are disposed in series with a resistor 405 (Rg) and parallel to a spark gap 406. Va is the total voltage impressed across the arrester. Vg is the fraction of Va that appears across the spark gap 406. Vm is the fraction of Va that appears across the MOV element 407. The first and second capacitors 401 and 402 are disposed on a first side of the resistor 405 and the third and fourth capacitors 403 and 404 are disposed on the opposite side of the resistor 405.

A gap assembly 421 in accordance with an exemplary embodiment of the present invention, as shown in FIGS. 20-23, includes a spark gap assembly 422 electrically in series with an MOV element 407.

Figure 21:
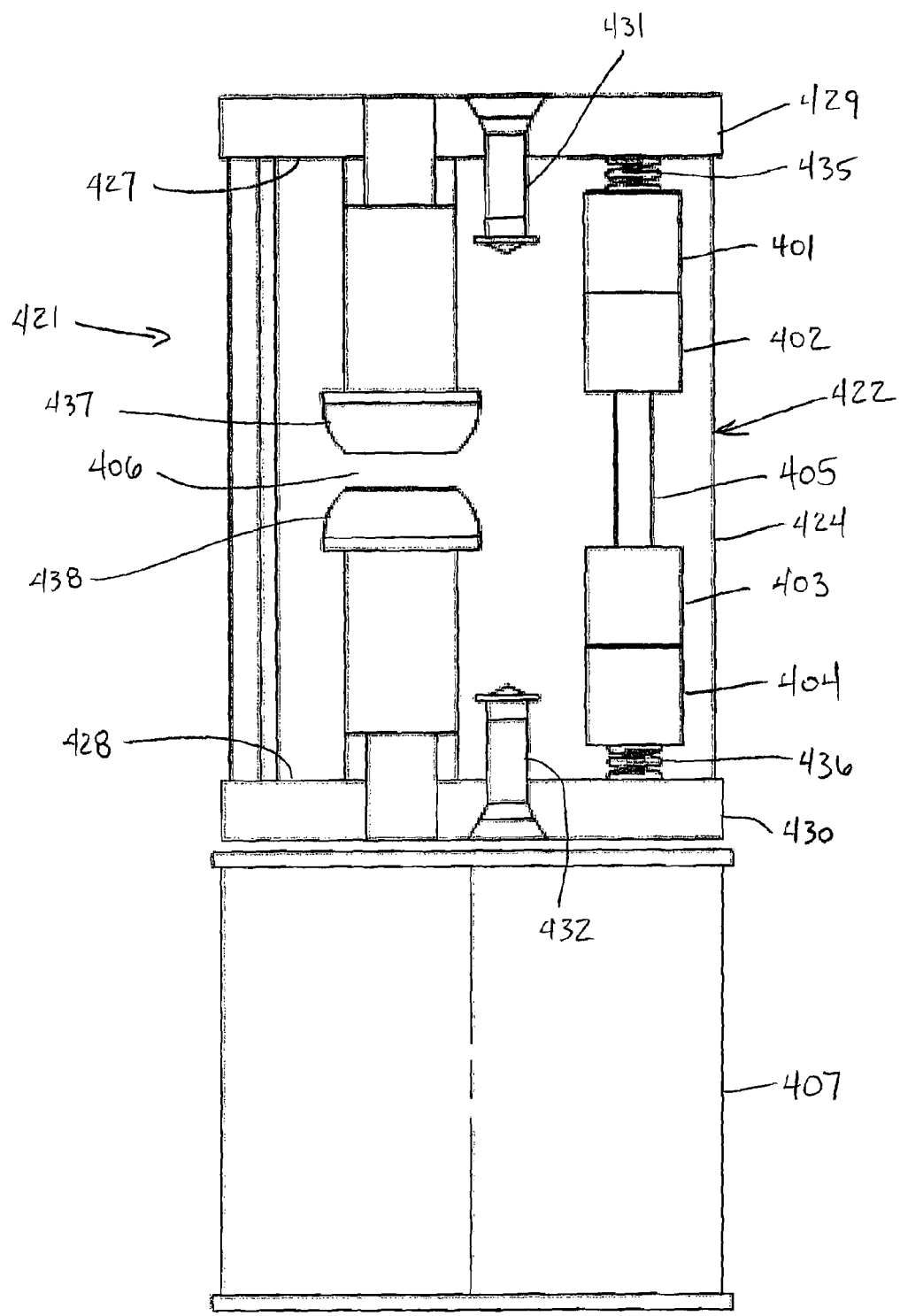
FIG. 21 is a side elevational view in partial cross section of the arrester of FIG. 20.

The spark gap assembly 422 includes an insulative housing 424 having a first bore 425 and a second bore 426 extending from an upper surface 427 of the housing 424 to a lower surface 428 thereof. An upper plate 429 is secured to the upper surface 427 of the housing 424 and a lower plate 430 is connected to the lower surface 428. The upper and lower plates 429 and 430 are made of a conductive material, such as, but not limited to, aluminum and copper. Fasteners 431 and 432 secure the upper and lower plates 429 and 430 to the upper and lower surfaces 427 and 428, respectively. The insulative housing 424 preferably has a diameter substantially equivalent to that of the MOV element 407, as shown in FIG. 21. The insulative housing 424 can be made of any suitable material, such as, but not limited to, ceramic, glass and nylon.

A spark gap 406 is disposed in the first bore 425. The spark gap 406 is formed between an upper electrode 437 connected to the upper plate 429 and a lower electrode 438 connected to the lower plate 430. Fasteners 439 and 440 secure the electrodes 437 and 438 to their respective plates 429 and 430.

Figure 22:
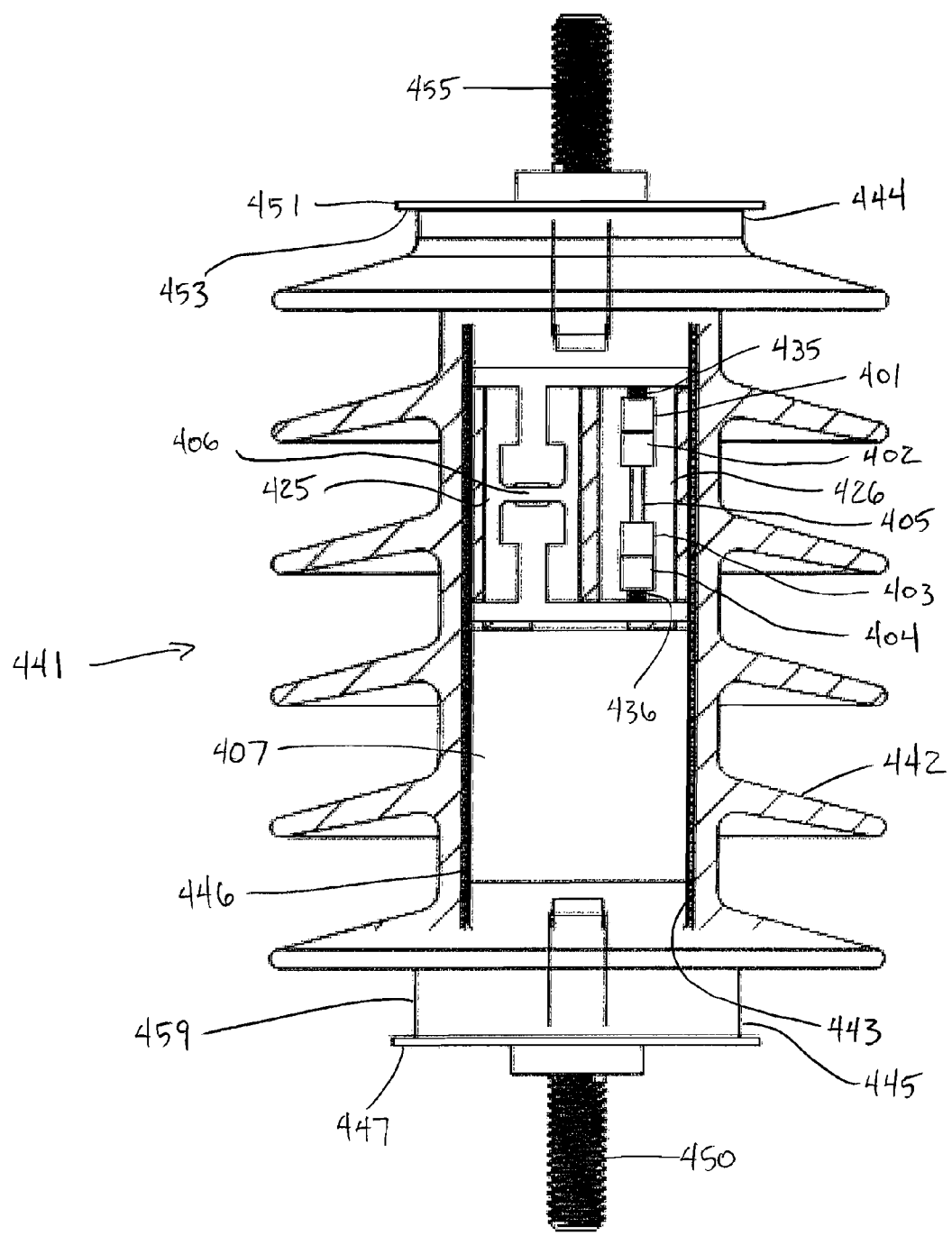
FIG. 22 is a front elevational view in partial cross section of the arrester of FIG. 20.
Figure 23:
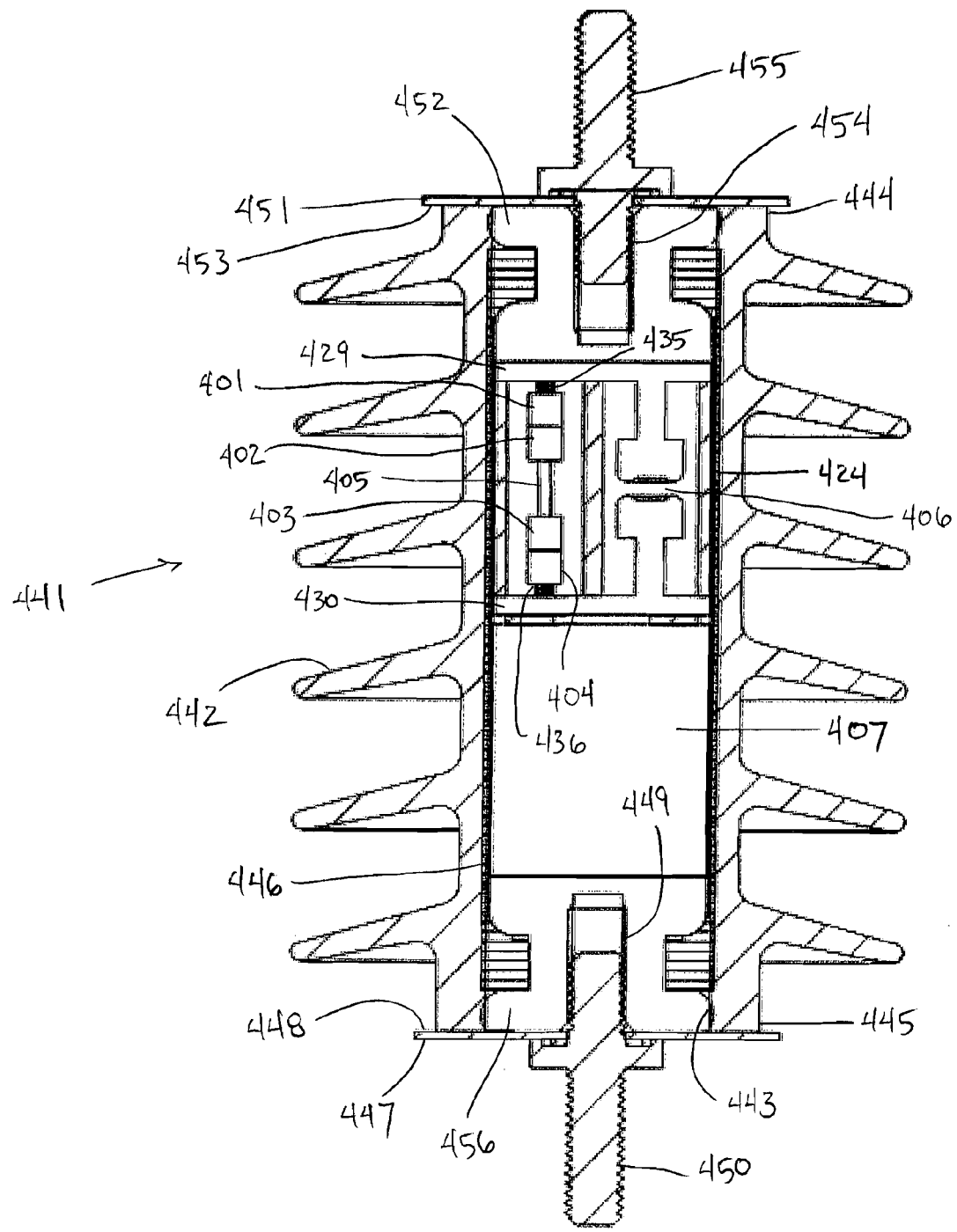
FIG. 23 is a front elevational view in cross section of the arrester of FIG. 20.

The resistor 405 and capacitors 401-404 are disposed in a second bore 426, as shown in FIGS. 21-23. The resistor 405 is disposed between an upper set of capacitors 401 and 402 and a lower set of capacitors 403 and 404. A first spring member 435 is disposed between the capacitor 401 and an upper plate 429. A second spring member 436 is disposed between the capacitor 404 and a lower plate 428. The first and second spring members 435 and 436 bias the capacitors 401-404 toward the resistor 405. Preferably, the first and second spring members 435 and 436 are compression springs. The first bore 425 preferably has a larger diameter than the second bore 26, as shown in FIGS. 22 and 23. Disposing the spark gap 406 in the first bore 425 and the resistor 405 and capacitors 401-404 in the second bore 426 isolates these two components from each other, thereby substantially preventing contamination of the resistor and capacitors by carbon created each time a spark crosses the spark gap 406.

The gap assembly 421 is disposed in an arrester 441, as shown in FIGS. 22 and 23. A weathershed housing 442 has a bore 443 extending from a first end 444 to a second end 445 of the housing 442. A tube 446 is disposed in the bore 43, as shown in FIGS. 22 and 23. Preferably, the tube 446 is made of fiberglass-epoxy, although any suitable material can be used. A lower plate 447 is disposed at the second end 445 of the housing 442. A lower terminal 456 is disposed on an upper surface 448 of the lower plate 447. An end of the lower terminal 456 has a fastener opening 449 to receive a lower terminal stud 450.

An upper plate 451 is disposed at the first end 444 of the housing 442. An upper terminal 452 is disposed adjacent a lower surface 453 of the upper plate 451. An end of the upper terminal 452 adjacent the upper plate 451 has a fastener opening 454 to receive an upper terminal stud 455.

The spark gap assembly 422 and the MOV element 407 are disposed within the tube 446 in the bore 443 in the arrester housing 442 between the upper terminal 452 and the lower terminal 456. The upper and lower terminal studs 455 and 450 are tightened to ensure electrical and mechanical connections from the upper terminal stud 455, through the components disposed in the housing bore 446 and to the lower terminal stud 450. The upper terminal stud 455 is connected to a power system 100 (FIG. 15). The lower terminal stud 450 is connected to ground 102 (FIG. 15). Bottom section 459 of the arrester housing 442 receives a bracket (not shown) connected to electrical equipment to be protected. The upper terminal 452 provides an electrical connection between the upper terminal stud 455 and the spark gap assembly 422. The lower terminal 456 provides an electrical connection between the MOV element 407 and the lower terminal stud 450.

The foregoing embodiment and advantages are merely exemplary and are not to be construed as limiting the scope of the present invention. The description of an exemplary embodiment of the present invention is intended to be illustrative, and not to limit the scope of the present invention. Various modifications, alternatives and variations will be apparent to those of ordinary skill in the art, and are intended to fall within the scope of the invention as defined in the appended claims and their equivalents.

What is claimed is:
1. A gap assembly for an arrester, comprising:
a spark gap assembly, including an insulative housing having a first bore and a second bore;

a resistor and a capacitor disposed in said first bore and electrically in series with one another to form a series connected resistor-capacitor combination;

a spring member disposed in said first bore and biasing one of said capacitor and said resistor toward the other of said capacitor and said resistor; and a spark gap disposed in said second bore and electrically in parallel with said series connected resistor-capacitor combination; and an MOV block disposed electrically in series with said spark gap assembly, wherein said series connected resistor-capacitor combination has an impedance characteristic at a selected power frequency response range essentially matching an impedance of said MOV block.

2. The gap assembly for an arrester according to claim 1, wherein
said second bore has a larger transverse diameter than said first bore.

3. The gap assembly for an arrester according to claim 1, wherein
said resistor is a linear resistor.

4. The gap assembly for an arrester according to claim 1, wherein
said resistor has a value of between approximately 10 kΩ-1000 kΩ.

5. The gap assembly for an arrester according to claim 4, wherein
said resistor has a value of between approximately 100-250 kΩ.

6. The gap assembly for an arrester according to claim 1, wherein
said capacitor has a capacitance of between approximately 20-150% of a capacitance of said MOV block.

7. The gap assembly for an arrester according to claim 6, wherein
said capacitor has a capacitance of between approximately 50-80% of said capacitance of said MOV block.

8. The gap assembly for an arrester according to claim 1, wherein
said capacitor and said MOV block have a capacitance of between approximately 70-400 pF.

9. The gap assembly for an arrester according to claim 1, wherein
an upper plate is disposed on an upper surface of said insulative housing and a lower plate is disposed on a lower surface of said insulative housing.

10. A gap assembly for an arrester, consisting essentially of:
at least one spark gap assembly including
at least one resistor and at least one capacitor disposed electrically in series with said at least one resistor to form a series connected resistor-capacitor combination; and
a spark gap disposed electrically in parallel with said series connected resistor-capacitor combination; and
at least one MOV block disposed electrically in series with said at least one spark gap assembly,
wherein said series connected resistor-capacitor combination has an impedance characteristic at a selected power frequency response range essentially matching an impedance of said MOV block.

11. The gap assembly for an arrester according to claim 10, wherein
said at least one resistor is a linear resistor.

12. The gap assembly for an arrester according to claim 10, wherein
said at least one resistor has a value of between approximately 10 kΩ-1000 kΩ.

13. The gap assembly for an arrester according to claim 12, wherein
said at least one resistor has a value of between approximately 100-250 kΩ.

14. The gap assembly for an arrester according to claim 10, wherein
said at least one capacitor has a capacitance of between approximately 20-150% of a capacitance of said at least one MOV block.

15. The gap assembly for an arrester according to claim 14, wherein
said at least one capacitor has a capacitance of between approximately 50-80% of said capacitance of said at least one MOV block.

16. The gap assembly for an arrester according to claim 10, wherein
said at least one capacitor and said at least one MOV block have a capacitance of between approximately 70-400 pF.

17. A method of assembling an arrester, comprising the steps of
disposing at least one capacitor electrically in series with at least one resistor to form a series connected resistor-capacitor combination having a first impedance characteristic;
disposing the series connected resistor-capacitor combination electrically in parallel with a spark gap to form a spark gap assembly; and
disposing the spark gap assembly electrically in series with at least one MOV block having a second impedance characteristic,
wherein said disposing of said at least one capacitor electrically in series with said at least one resistor comprises essentially matching at a selected power frequency response range the first impedance characteristic of the series connected resistor-capacitor combination with the second impedance characteristic of the at least one MOV block.

18. The method of assembling an arrester according to claim 17, further comprising
disposing the at least one capacitor and the at least one resistor in a first bore of an insulative housing and disposing the spark gap in a second bore of the insulative housing.

19. The method of assembling an arrester according to claim 17, wherein
the at least one capacitor and the at least one MOV block have a capacitance of between approximately 70-400 pF.

20. The method of assembling an arrester according to claim 17, wherein
the at least one capacitor has a capacitance of between approximately 20-150% of the capacitance of the at least one MOV block.

21. A gap assembly for an arrester, comprising:
at least one spark gap assembly, including
at least one resistor and at least one capacitor disposed electrically in series with said at least one resistor to form a series connected resistor-capacitor combination, and
a spark gap disposed electrically in parallel with said series connected resistor-capacitor combination; and at least one MOV block disposed electrically in series with said at least one spark gap assembly, wherein said series connected resistor-capacitor combination has an impedance characteristic at a selected power frequency response range essentially matching an impedance of said at least one MOV block.

22. The gap assembly for an arrester according to claim 21 wherein said series connected resistor-capacitor combination produces a non-linear grading between said spark gap and said MOV block during an overvoltage surge, and produces a linear grading between said spark gap and said at least one MOV block at a power frequency.

23. The gap assembly for an arrester according to claim 21 wherein said impedance of said series connected resistor-capacitor combination is configured to interact with said impedance of said at least one MOV block to control voltage across said spark gap as a function of total applied voltage and a frequency of an overvoltage surge.

\* \* \* \* \*